(12) United States Patent
Sauciuc et al.

(10) Patent No.: US 7,340,904 B2
(45) Date of Patent: Mar. 11, 2008

(54) METHOD AND APPARATUS FOR REMOVING HEAT

(75) Inventors: Ioan Sauciuc, Phoenix, AZ (US); Jim D. Williams, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 461 days.

(21) Appl. No.: 10/976,406

(22) Filed: Oct. 29, 2004

(65) Prior Publication Data

US 2006/0090474 A1    May 4, 2006

(51) Int. Cl.
     *F25B 21/02*    (2006.01)
(52) U.S. Cl. .............................. 62/3.2; 62/3.7; 62/259.2
(58) Field of Classification Search ................... 62/3.2, 62/3.7, 238.1, 259.2; 310/52; 165/104.19, 165/104.22
See application file for complete search history.

(56) References Cited

U.S. PATENT DOCUMENTS

| | | | |
|---|---|---|---|
| 6,261,471 B1 * | 7/2001 | Tsuda et al. ............. | 252/62.52 |
| 6,619,044 B2 * | 9/2003 | Batchelor et al. ............. | 62/3.3 |
| 6,658,861 B1 * | 12/2003 | Ghoshal et al. ............... | 62/3.7 |
| 6,705,089 B2 * | 3/2004 | Chu et al. ..................... | 62/3.2 |

* cited by examiner

*Primary Examiner*—Melvin Jones
(74) *Attorney, Agent, or Firm*—Blakely, Sokoloff, Taylor & Zafman LLP

(57) ABSTRACT

A device includes a liquid metal and a ferrofluid contained in a closed tube. Many electrode groups are connected to the closed tube. A feedback device is connected to the electrode groups. The feedback device switches power to each electrode group in series to circulate the liquid metal and move the ferrofluid in the closed tube.

36 Claims, 7 Drawing Sheets

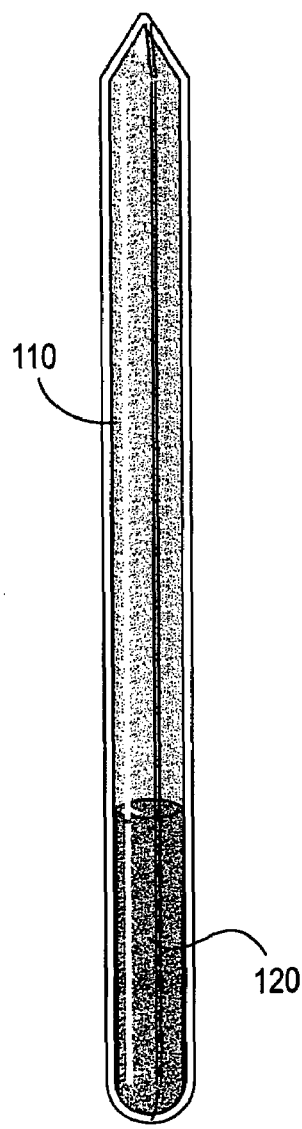
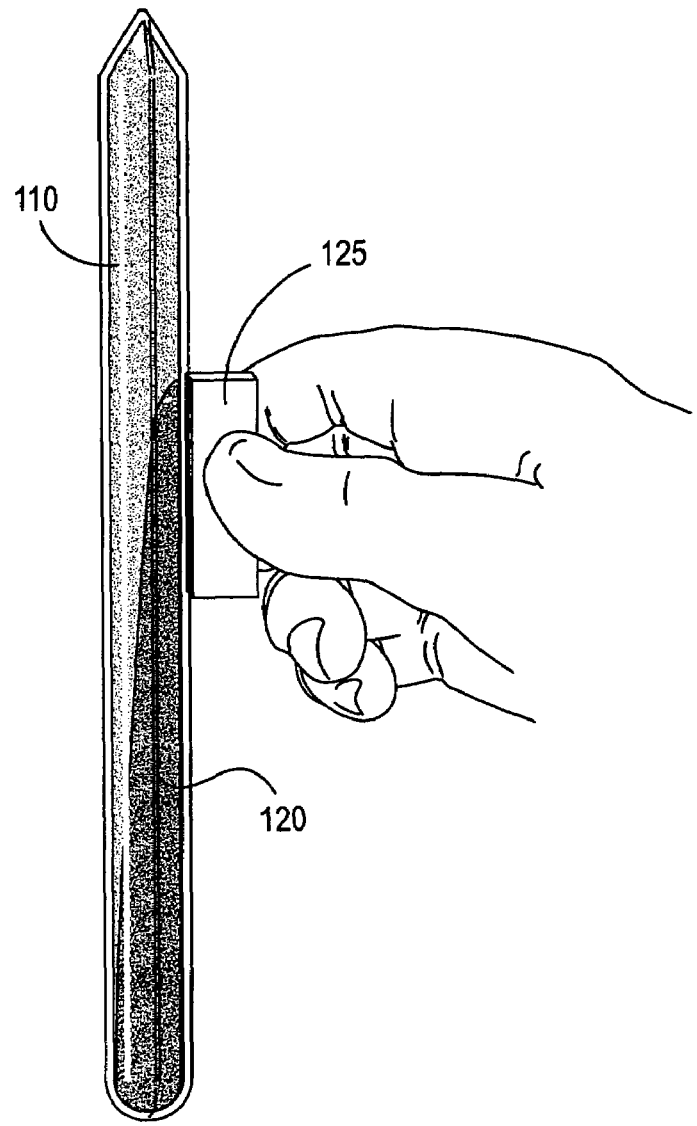
FIG. 1A
(Prior Art)
FIG. 1B
(Prior Art)

METHOD AND APPARATUS FOR REMOVING HEAT

BACKGROUND

1. Field

The embodiments relate to cooling by removing heat, and more particularly to removing heat of a device using forced convection liquid metal combined with thermoelectric and a ferrofluid.

2. Description of the Related Art

Cooling is one of the main concerns for computer and processor manufacturers and developers. The industry depends on functional cooling techniques to help cool their rapidly advancing chips, which tend to run hotter and hotter. Without proper cooling, design engineers will end up sacrificing performance and power for lower temperatures and stability.

Initially, passive cooling was enough to keep central processing units (CPUs) in a stable state. As chips evolved, however, so did cooling due to necessity. A transition from aluminum and copper to graphite heat sinks, and from passive to active cooling (i.e., using a fan to force out the heat that dissipates into the CPUs surrounding airflow) has kept pace with the advances in processing power. Some computer designers have used water-cooling, which uses water to transfer the heat directly from a chip's surface more efficiently and effectively. Water-cooling, however, is not enough to completely eliminate certain hot areas that form on processors with higher heat output.

One newer technique uses active microchannel cooling, which actively cools a processor with micro channels. Microchannels are extremely small grooves and ridges machined into the silicon block that collect heat from the processor. The microchannels are about the width of a human hair, less than 1/32 of an inch wide. As compared with water-cooling, the microchannels in the active microchannel cooling system are much more efficient, since there is a larger surface area for the heat to dissipate. Another advantage of microchannels is that since they are machined using standard silicon machining techniques, the price of manufacturing is low and any defects in the product are minimal. One of the benefits of using microchannels for cooling is the efficient heat removal from CPU hot spots. Typical microchannels are approximately 1.5 mm away from any given hot area. Therefore, the distance that the heat must travel to be dissipated is effectively reduced. An interesting aspect of active microchannel cooling is that the microchannels are made from silicon, a material not usually known for its heat-dissipation properties. Since silicon is a semiconductor, it shares some characteristics of metals and non-metals. Metals are usually good conductors of heat, but compared to metals, silicon dissipates heat poorly. Advantages of using silicon are, for example, silicon is the second most abundant element in the earth's crust. Therefore, cooling via microchannels help keep the price of computers/processors down.

An electro-kinetic pump is a feature of active microchannel cooling. The pump uses an electro-kinetic effect to propel cooling fluid through a porous glass disk without any moving parts. The pump works by positively charging the cooling fluid, therefore generating positively charged hydrogen atoms. The hydrogen atoms then repel against the negatively charged glass and push the fluid through the disk. Because it uses no moving parts, the pump should be reliable and is almost completely silent.

Besides microchannel cooling using a silent pump, an optional fan can be attached to a radiator. The radiator in the active microchannel cooling system doesn't need to have a fan attached, and the system is completely silent unless the user opts to have maximum cooling. A small, yet important factor in cooling is the size of any cooling system. While air-cooling requires large fans, active microchannel cooling uses a thin silicon block and a small radiator. Compared to water-cooling systems, the size of the active microchannel cooling is very small.

One drawback to active microchannel cooling is the installation process. As compared to adding an air-cooling system to a computer, which is as simple as screwing a heat sink to the motherboard and attaching a fan, active microchannel cooling can require installing brackets for the pump and radiator, and installing tubing in a computer system.

Another type of cooling technique is the use of a heat pipe. A heat pipe is self-powered and transfers heat to a side edge of a computer or notebook computer, where air fins or a tiny fan can be used to dissipate the unwanted heat into air. A heat pipe uses tiny liquid-filled pipes to shuttle heat to pre-chosen locations for dispersal. In the heat pipe loop, heat from a processor changes liquid, for example methanol, to vapor. The vapor absorbs heat at a pre-selected site, changes back to liquid and wicks back to its starting point to collect more heat.

Thermoelectric modules (TEM) have also been used as active cooling devices. By placing a TEM between a device or object to be cooled, such as an integrated circuit, and a heat sink and supplying the TEM with a current, the TEM transfers heat from the integrated circuit to the heat sink. The phenomenon is called the Peltier effect. The TEM consists of ceramic plates with p-type semiconductor material and n-type semiconductor material between the plates. The elements of semiconductor material are connected electrically in series. When a direct current (DC) voltage is applied to the semiconductor material, electrons pass from the p-type material to the n-type material. The elements are arranged in a manner such that when a DC voltage is applied, heat is transferred from one side of the TEM to the other. The rate of transfer is proportional to the current and the number of p-n junctions.

The problem of cooling computers, notebooks and processors will continue as performance increases.

BRIEF DESCRIPTION OF THE DRAWINGS

Embodiments are illustrated by way of example and not by way of limitation in the figures of the accompanying drawings in which like references indicate similar elements. It should be noted that references to "an" embodiment in this disclosure are not necessarily to the same embodiment, and they mean at least one.

FIG. 1A illustrates a ferrofluid in a glass container.

FIG. 1B illustrates the ferrofluid in FIG. 1A being moved with a magnet.

DETAILED DESCRIPTION

Figure 2:
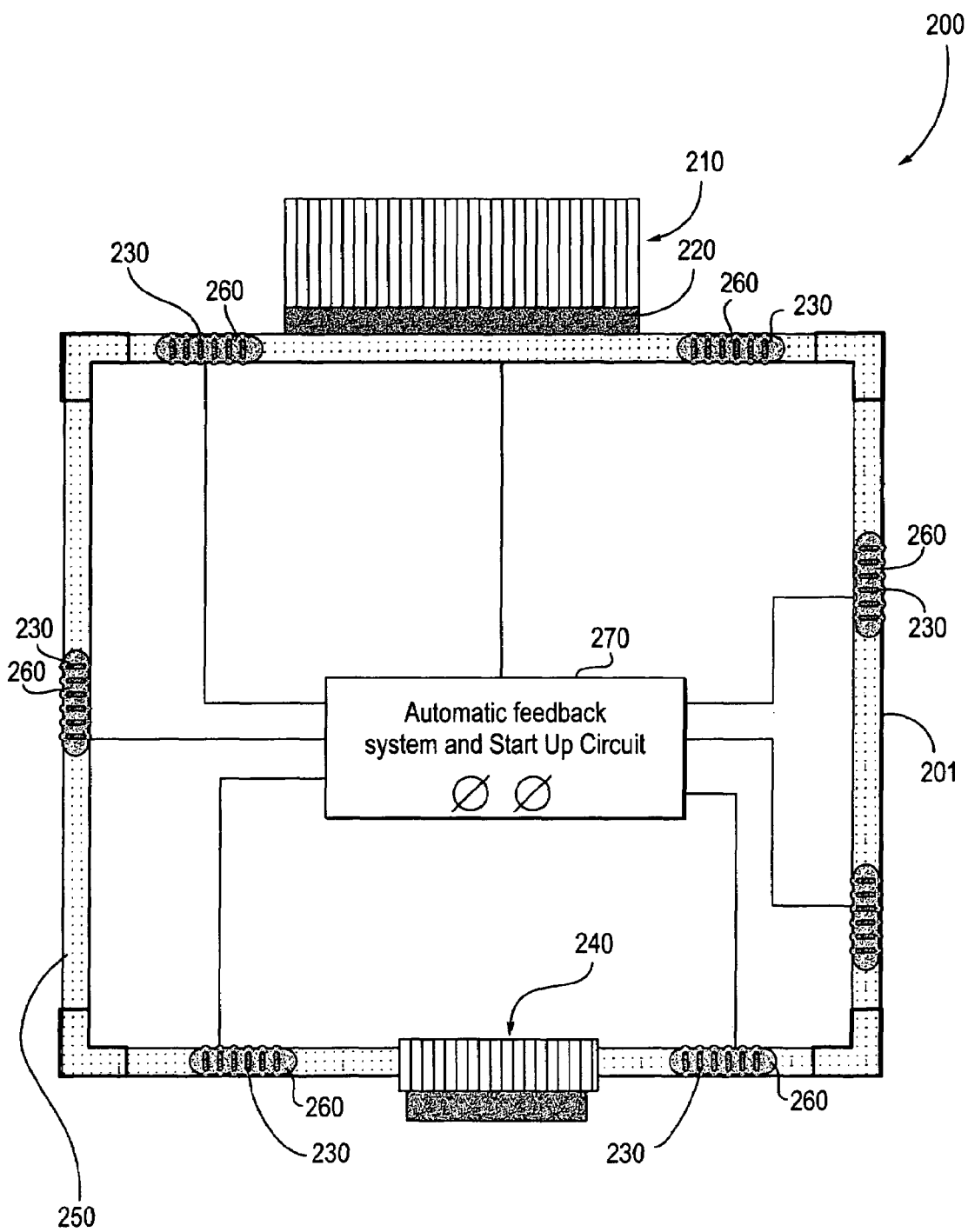
FIG. 2 illustrates an embodiment including a heat removing device.

The embodiments discussed herein generally relate to device cooling using ferrofluid pumping of liquid metal flowing over a die combined with thermoelectrics for refrigeration type performance without using a compressor. Ferrofluids are used to help with pumping of the liquid metal. Referring to the figures, exemplary embodiments will now be described. The exemplary embodiments are provided to illustrate the embodiments and should not be construed as limiting the scope of the embodiments.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" is not necessarily all referring to the same embodiment. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

A ferrofluid is a stable colloidal suspension of sub-domain magnetic particles in a liquid carrier. The particles, which have an average size of about 100 Å (10 nm), are coated with a stabilizing dispersing agent (surfactant) that prevents particle agglomeration even when a strong magnetic field gradient is applied to the ferrofluid. The surfactant must be matched to the carrier type and must overcome the attractive van der Waals and magnetic forces between the particles. The colloid and thermal stabilities, crucial to many applications, are greatly influenced by the choice of the surfactant. A typical ferrofluid may contain by volume 5% magnetic solid, 10% surfactant and 85% carrier.

In the absence of a magnetic field, the magnetic moments of the particles are randomly distributed and the fluid has no net magnetization. When a magnetic field is applied to a ferrofluid, the magnetic moments of the particles orient along the field lines almost instantly. The magnetization of the ferrofluid responds immediately to the changes in the applied magnetic field and when the applied field is removed, the moments randomize quickly. In a gradient field the whole fluid responds as a homogeneous magnetic liquid that moves to the region of highest flux. This means that ferrofluids can be precisely positioned and controlled by an external magnetic field. The forces holding the magnetic fluid in place are proportional to the gradient of the external field and the magnetization value of the fluid. This means that the retention force of a ferrofluid can be adjusted by changing either the magnetization of the fluid or the magnetic field in the region.

The operating life of the product depends on the volatility of the ferrofluid. Products that require long life must use ferrofluids with low evaporation rate or vapor pressure. Also, seals operating at high vacuum must incorporate low vapor pressure fluids. In general, the lower the volatility, the higher the viscosity of the ferrofluid. Thermal conductivity of a ferrofluid generally depends linearly on the solid loading.

Ferrofluids are typically used as an active component that contributes towards the enhanced performance of a device. The typical devices ferrofluids are used in are either mechanical (e.g., seals, bearings and dampers) or electromechanical (e.g., loudspeakers, stepper motors and sensors) in nature. In other cases, ferrofluid is employed simply as a material for nondestructive testing of other components such as magnetic tapes, stainless steels and turbine blades.

FIG. 1A illustrates ferrofluid 120 in sealed glass tube 110. As asserted above, when a magnet is brought near a ferrofluid, the liquid will actually move. This is illustrated in FIG. 1B, which illustrates a magnet 125 attracting the ferrofluid 120 to move ferrofluid 120 upwards in sealed glass tube 110. If a magnetic field around a ferrofluid is oscillatory, then the magnetic field will drive the ferrofluid at the same frequency. Simple dynamic systems have a natural frequency. If they are driven at that frequency, then some kind of usual behavior generally occurs. For example, if a crystal wine glass is driven (e.g., by someone singing) at the natural frequency, then the glass shatters. If a fluid in a vessel is driven at its natural frequency, then splashing occurs. Splashing is when the top of a wave crest splits off from the rest of the wave and is ejected upwards.

FIG. 2 illustrates one embodiment of a heat removing (i.e., cooling) device. Device 200 includes closed tube 201. Contained within closed tube 201 are many groups of ferrofluid volumes 260. In one embodiment closed tube 201 is made from a metal. In one embodiment, closed tube 201 is made from a metal that does not attract ferrofluid 260. In one embodiment the ferrofluid volumes include a ferrofluid having saturation magnetization values less than 47.5 milliTesla (mT) and greater than 40 mT. Ferrofluids in this range are commercially available through companies, such as FerroTec Corporation (see, http://www.fero.com./usa/ferrofluid.htm). The selected saturation magnetization is about thirty (30) times less as compared to iron, which has a saturation magnetization of 1.7 Tesla (T). Since the saturation magnetization of ferrofluid 260 is small, the size of electrode groups 230 and current needed to form a magnetic field is small. This makes embodiments useful for small form factor applications, such as notebook/laptop computers, palm computers, personal digital assistants (PDAs), etc.

High conductivity liquid metal 250 is contained within closed tube 201. In one embodiment, liquid metal 250 is mercury or a mercury alloy. In another embodiment the liquid metal can be an alloy of Gallium, Indium and Sn eutectic alloy.

In one embodiment microchannels 240 are connected to closed tube 201. In another embodiment macrochannels are used instead of microchannels 240. In another embodiment microchannels/macrochannels are not used. Microchannels 240 help dissipate heat generated by a processor (e.g., a central processing unit (CPU)) if connected to microchannels 240 and closed tube 201. In another embodiment an electro-kinetic pump is connected to microchannels 240. In yet another embodiment, a fan is connected close to microchannels 240.

Electrode groups 230 are spaced apart and connected to closed tube 201. Feedback device 270 is connected to groups of electrodes 230. Liquid metal 250 is circulated through closed tube 201 when feedback device 270 switches power to each electrode group. A magnetic field is generated around each electrode group when receiving power from feedback device 270. The small magnetic field is enough to move a ferrofluid volume 260, which in turn moves liquid metal 250. In one embodiment, feedback device 270 receives power from a power source, such as a rechargeable battery, an alternating current (AC) to direct current (DC) adapter, a solar energy collection device, an adapter connected to a cigarette lighter receptacle in a vehicle, etc.

In one embodiment remote heat exchanger 210 is connected to thermoelectric module 220, which is connected to closed tube 201. As liquid metal 250 is circulated through closed tube 201 it comes in thermal contact with the cold side of thermoelectric module 220 and heat is removed to remote heat exchanger 210. Thus the liquid metal temperature can be dropped even below ambient temperature, making it possible to obtain a refrigeration device with no moving parts (in one embodiment) or without using a vapor compressor.

In one embodiment feedback device 270 starts circulating liquid metal 250 by switching power (e.g., voltage, current) between electrode groups 230 in a predetermined sequence, such as a series sequence where switching takes place every ¼ second, ⅛ second, or any other chosen increment. Once liquid metal 250 is circulating within closed tube 201, feedback device 270 senses the device (i.e. CPU) temperature with a temperature sensor located within the device. Based on the sensed temperature, feedback device 270 can increase the switching time or decrease the switching time to either slow down circulation or speed up circulation of liquid metal 250. A predetermined acceptable temperature range is selected based on the use and type of device to be cooled. The predetermined temperature range is used to determine magnetic field intensity and switching speed to each electrode group 230. The higher the current through electrode groups 230, the more movement ferrofluid 260. The faster switching of magnetic fields through electrode groups 230 also increases circulation speed of liquid metal 250.

In one embodiment ferrofluid volumes 260 are spaced apart and remain in an active electrode region formed by each electrode group 230. The size and number of electrode groups 230 can vary depending on application. For example, where device 200 is used for cooling a processor, seven (7) or eight (8) electrode groups 230 and ferrofluid volumes 260 can be used. Tubing size can also vary as with volume of ferrofluid 260 and liquid metal 250. In another embodiment electrodes 230 are placed all around tube 201 equally spaced.

Figure 3:
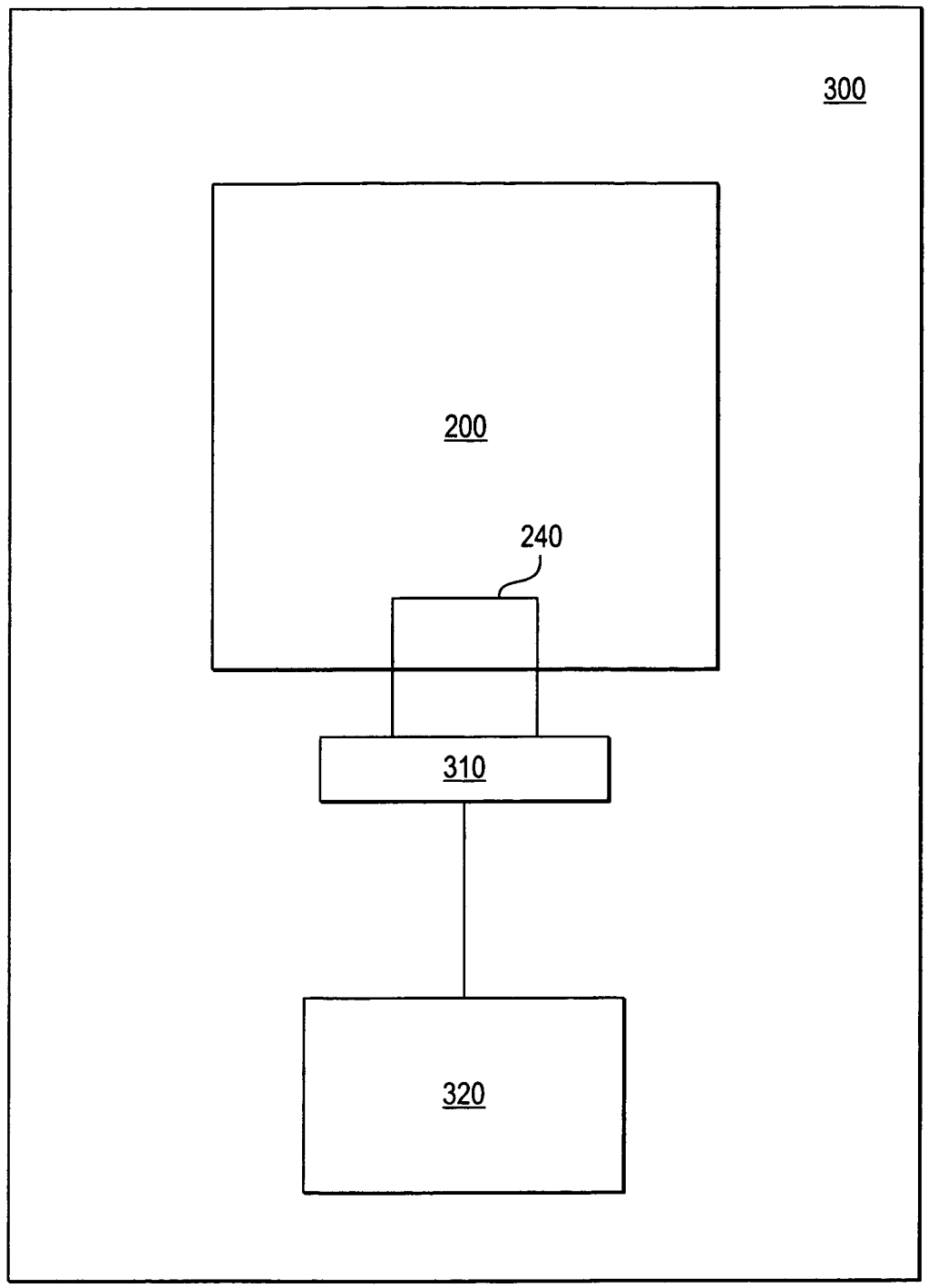
FIG. 3 illustrates a system of an embodiment.

FIG. 3 illustrates an embodiment of a system including device 200. System 300 includes device 200 connected to a processor 310 (e.g., a CPU) and a memory device 320. Processor 310 is connected to closed tube 201 and microchannels 240. In one embodiment, processor 310 is manufactured with microchannels 240 as part of a chip package (i.e., microchannels 240 are directly formed on processor 310). In another embodiment microchannels 240 are not used.

Memory device 320 is a device such as random-access memory (RAM), static random access memory (SRAM), dynamic random access memory (DRAM), synchronous DRAM (SDRAM), read-only memory (ROM), etc. Device 200 removes heat generated by processor 310.

In one embodiment system 300 is disposed within a notebook/laptop computer. In another embodiment, system 300 is disposed in a vehicle computer, a desktop computer, a palm held computer, a PDA, etc.

Figure 4:
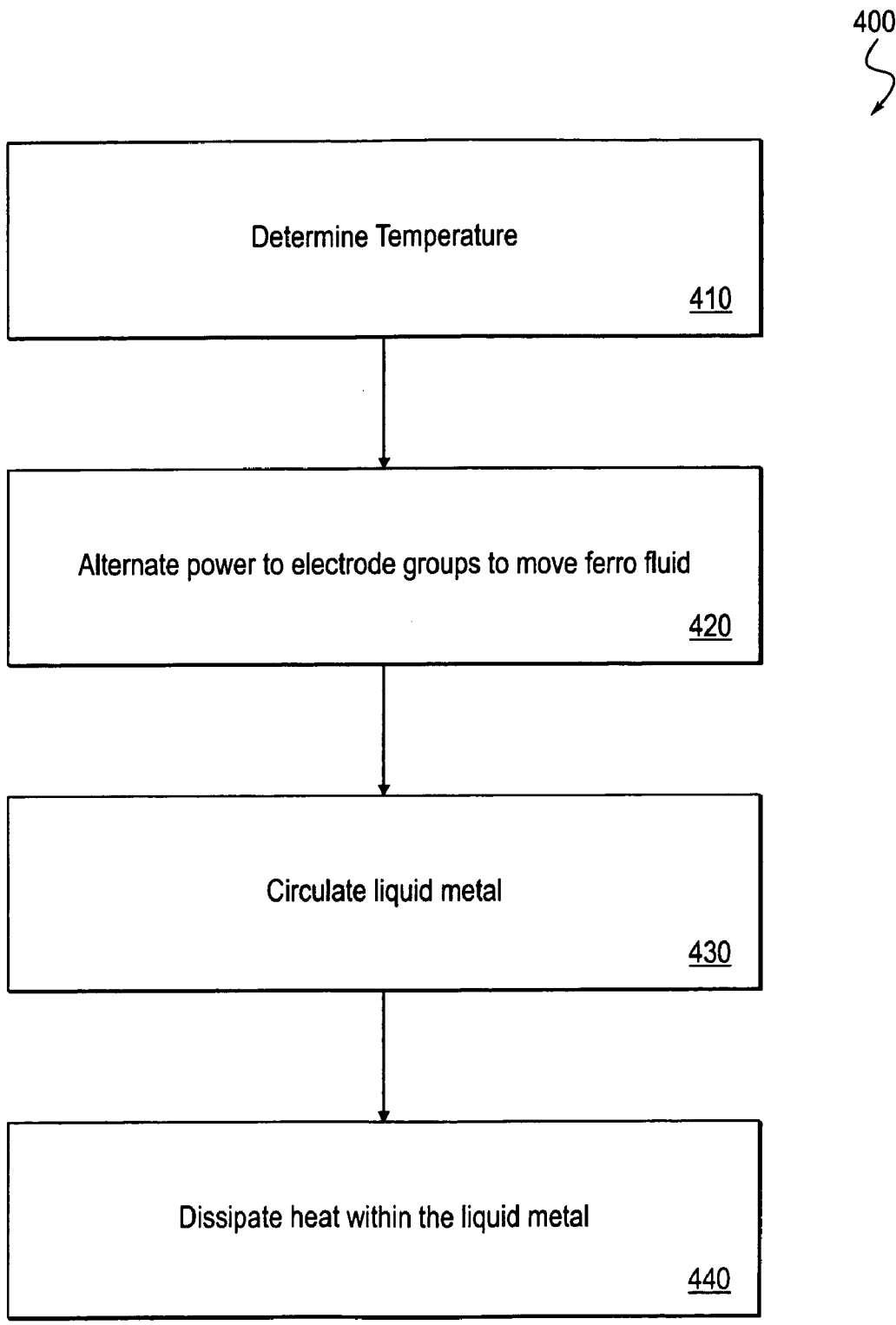
FIG. 4 illustrates a block diagram of a process of an embodiment.

FIG. 4 illustrates a block diagram of a process of an embodiment. In one embodiment process 400 is a process of using device 200. Process 400 begins with block 410 where temperature of a device (e.g., a CPU, processor, etc.) is determined with a temperature sensor. Block 420 alternates power to electrode groups connected to closed tube 201 based on the determined temperature. That is, if the determined temperature is higher than a predetermined acceptable range, then power will be alternated faster to move ferrofluid 260 faster. Block 430 circulates liquid metal 250 through closed tube 201 with magnetic fields formed by the electrode groups and with moving groups of ferrofluid volume 260. In block 440 heat is dissipated from within liquid metal 250 through circulating liquid metal 250 and by having thermoelectric module 220 coupled to remote heat exchanger 210. Additional heat can be removed from a processor connected to closed tube 201 by exchanging heat using microchannels 240 and an electro-kinetic pump.

Figure 5:
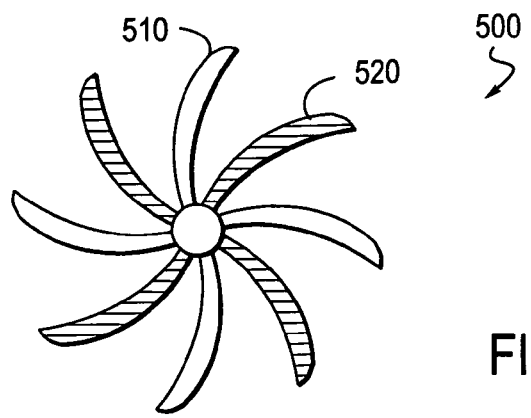
FIG. 5 illustrates rotating device having ferrofluid for an embodiment including a heat removing device.

FIG. 5 illustrates a rotation device for one embodiment having ferrofluid disposed within a portion of plastic blades. Rotation device 500 includes a number of blades 510 connected to a hub. The hub can be a spindle, a rod, etc. that keeps rotation device 500 steady to spin along an axis. In one embodiment, rotation device 500 has six (6) blades 510. It should be noted that other numbers of blades 510 can be implemented, such as five (5), seven (7), etc. In one embodiment, two of blades 510 have a ferrofluid 520 (similar to ferrofluid volumes 260) disposed within blade 510. In this embodiment, the two blades 510 having ferrofluid 520 disposed within are positioned opposing one another on rotation device 500. It should be noted that other embodiments can have more than two blades 510 with ferrofluid 520 disposed within it. In one embodiment rotation device 500 is structured as a fan or propeller. In another embodiment rotation device 500 is structured as an impeller.

Figure 6:
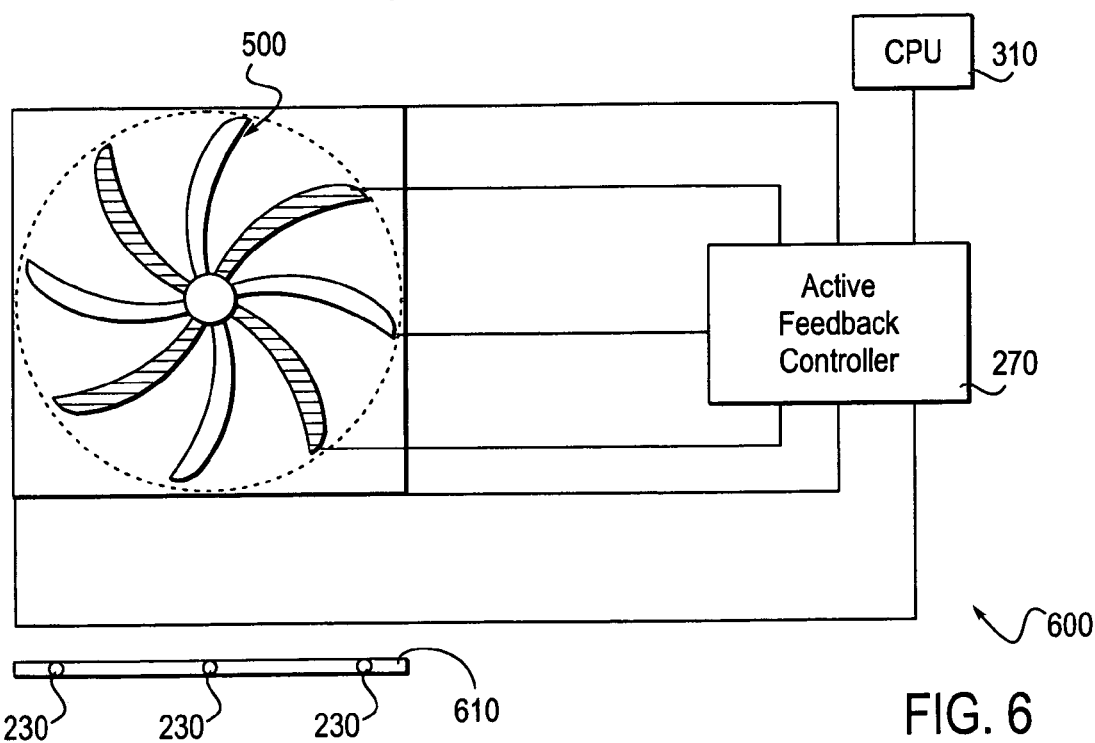
FIG. 6 illustrates another view of the device of FIG. 5 included in an embodiment.

FIG. 6 illustrates an embodiment having rotation device 500. Device 600 includes CPU 310, feedback device 270 driving plate 610 that is coupled to electrodes 230. In one embodiment electrodes 230 are radially coupled to driving plate 610 and function similarly to as described above. Feedback device 270 switches current through each electrode 230. The switching of current causes blades 510 having ferrofluid 520 disposed within it will follow the active electrode. In one embodiment each electrode of device 600 is switched in series. In one embodiment feedback device 270 uses a temperature sensor to sense temperature of CPU 310. If the temperature of CPU 310 is above a predetermined temperature threshold, feedback device 270 adjusts current and increases switching to electrodes 230 to increase the rotation of rotation device 500.

Figure 7:
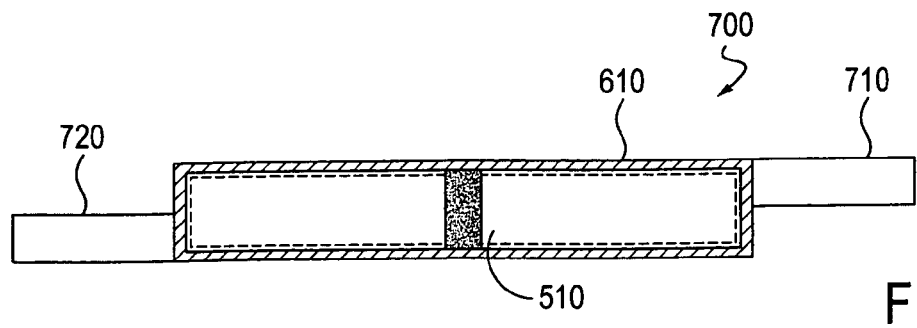
FIG. 7 illustrates the device of FIG. 5 coupled to a closed tube.

FIG. 7 illustrates rotation device 500 disposed within device 700. In one embodiment, device 700 acts as a pump. Device 700 includes inlet 720, outlet 710 and driving plate 610 coupled to electrodes 230. Electrodes 230 receive current to create a magnetic field to move rotation device 510 including ferrofluid 520 disposed within blades 510. In this embodiment continuous rotation results from current switching to each electrode 230, which in turn causes continuous pumping of a fluid entering inlet 720 and being either pulled or pushed to outlet 710. In one embodiment, the fluid being moved is the same as liquid metal 250.

Figure 8:
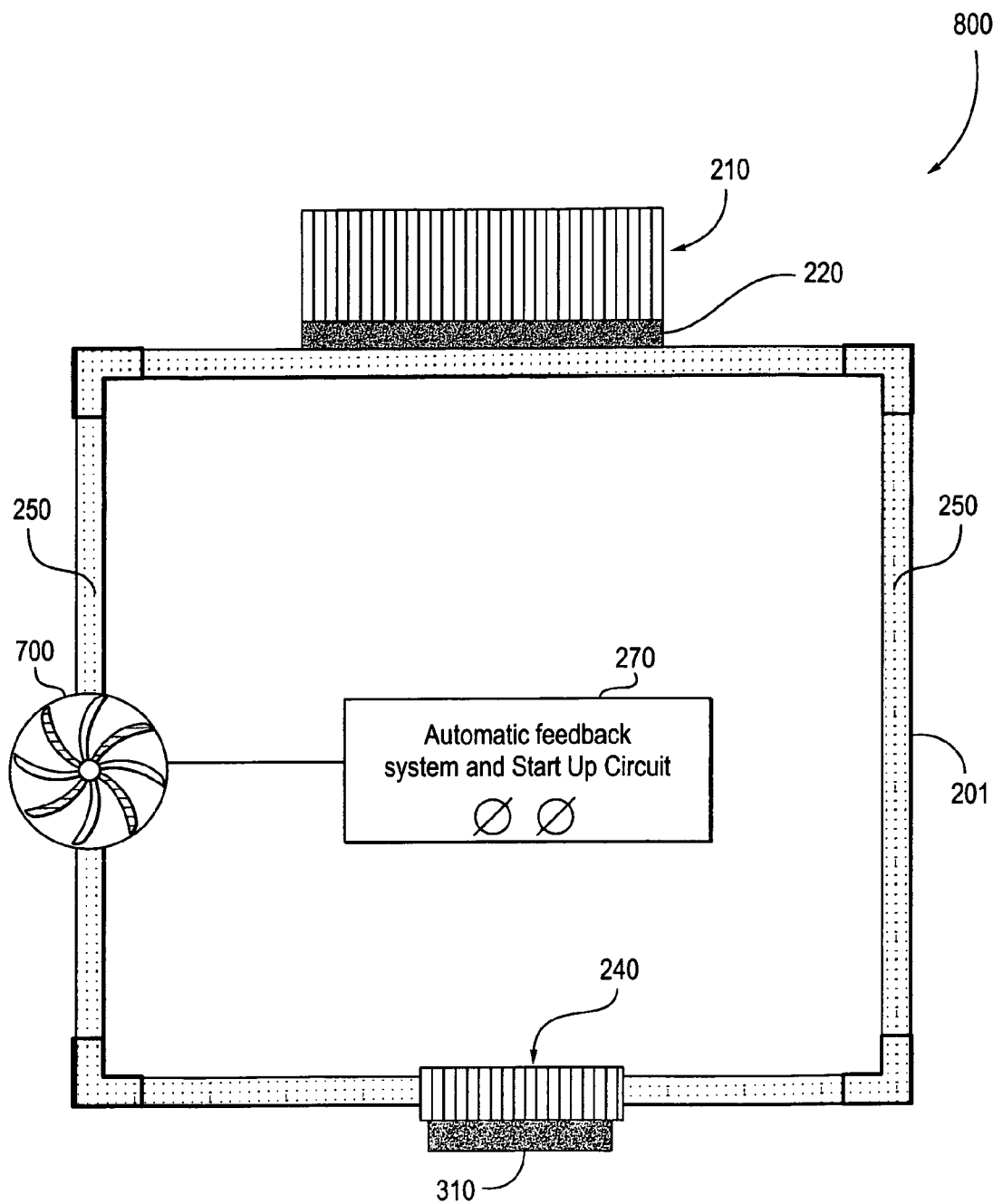
FIG. 8 illustrates another embodiment including a heat removing device.

FIG. 8 illustrates an embodiment for removing heat including device 700. Device 800 includes closed tube 201 filled with liquid metal 250, feedback device 270, remote heat exchanger 210 connected to thermoelectric module 220, microchannels 240 (optional) and CPU 310 connected to closed tube 201 and device 700 connected to closed tube 201. In this embodiment, device 700 acts to circulate liquid metal 250 through closed tube 201. In this embodiment, device 700 replaces ferrofluid volumes 260 and the electrode groups that are placed around closed tube 201 to circulate liquid metal 250 to remove heat from CPU 310 and refrigerate by using thermoelectric module 220.

Figure 9:
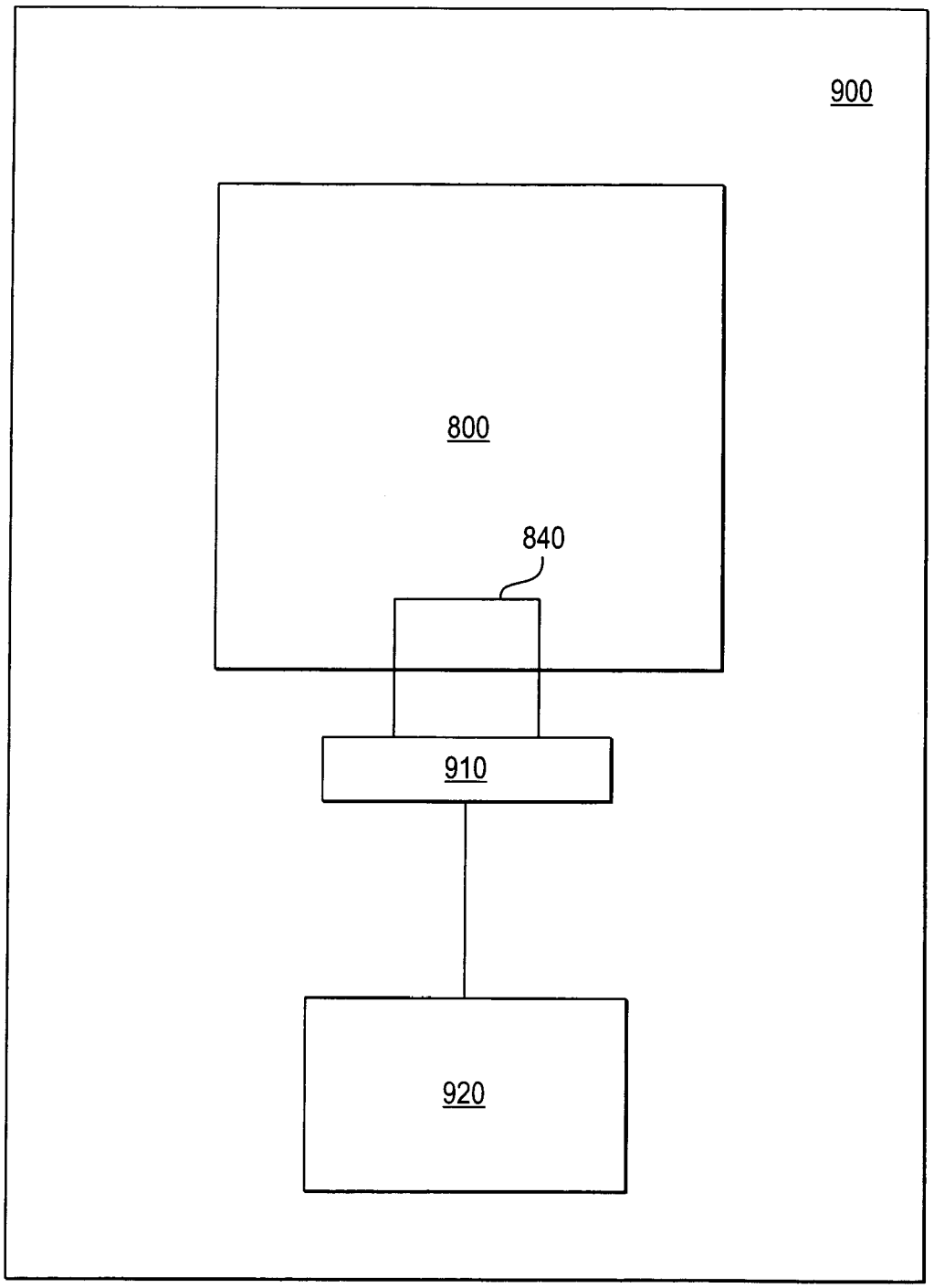
FIG. 9 illustrates a system of another embodiment.

FIG. 9 illustrates a system of an embodiment including device 800. System 900 is similar to system 300 except for device 800 replacing device 200.

In one embodiment process 400 is used to remove heat by using device 700. In this embodiment block 420 alternates power to electrodes 230 connected to driving plate 610 based on the determined temperature. That is, if the determined temperature is higher than a predetermined acceptable range, then power will be alternated faster to rotate rotation device 500 faster. Block 430 circulates liquid metal 250 through closed tube 201 with magnetic fields formed by the electrodes 230 and with rotating rotation device 500 by forming magnetic fields around blades 510 including ferrofluid 520. In this embodiment, in block 440 heat is dissipated from within liquid metal 250 through circulating liquid metal 250 and by having thermoelectric module 220 connected to remote heat exchanger 210. In one embodiment, additional heat can be removed from a processor connected (e.g., CPU 310) to closed tube 201 by exchanging heat using microchannels 240 and an electro-kinetic pump.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
   a closed tube;
   a plurality of ferrofluid volumes contained within the closed tube; liquid metal contained within the closed tube;
   at least one heat removing device coupled to the closed tube;
   a plurality of electrode groups coupled to the closed tube; and
   a feedback device coupled to the plurality of electrode groups,
   wherein the liquid metal is circulated through the closed tube,
   wherein the plurality of ferrofluid volumes remain in an active electrode region.

2. The apparatus of claim 1, wherein the at least one heat removing device comprises a plurality of microchannels.

3. The apparatus of claim 2, further comprising: a remote heat exchanger coupled to a thermoelectric module.

4. The apparatus of claim 1, wherein the feedback device switches power between the plurality of electrode groups based on sensed temperature.

5. The apparatus of claim 1, wherein the plurality of ferrofluid volumes have a saturation magnetization value less than 40 mT.

6. The apparatus of claim 1, wherein the feedback device controls circulation of the liquid metal with frequency of switching power to each of the plurality of electrode groups and magnetic field intensity of each of the plurality of electrode groups.

7. The apparatus of claim 1, wherein the liquid metal is mercury.

8. An apparatus comprising:
   a liquid metal and a ferrofluid contained in a closed tube;
   a plurality of electrode groups coupled to the closed tube;
   a feedback device coupled to the plurality of electrode groups;
   wherein the feedback device switches power to each electrode group of the plurality of electrode groups in series to circulate the liquid metal and move the ferrofluid in the closed tube, and the ferrofluid remains in an active electrode region.

9. The apparatus of claim 8, further comprising: a heat removing device including a plurality of microchannels and an electro-kinetic pump.

10. The apparatus of claim 9, further comprising: a remote heat exchanger coupled to a thermoelectric module.

11. The apparatus of claim 8, wherein the feedback device switches power between the plurality of electrode groups based on sensed temperature.

12. The apparatus of claim 8, wherein the feedback device controls circulation of the liquid metal with frequency of switching power to each of the plurality of electrode groups and magnetic field intensity of each of the plurality of electrode groups.

13. The apparatus of claim 8, wherein the microchannels are coupled to a fan.

14. An apparatus comprising:
   means for creating a plurality of electric fields, wherein the plurality of electric fields spaced apart along a closed tube;
   a mixture of liquid metal and ferrofluid contained within the closed tube;
   means for circulating the mixture through the closed tube, and
   means for removing heat from the mixture, wherein the ferrofluid remains in an active region of the plurality of electric fields.

15. The apparatus of claim 14 the means for creating a plurality of electric fields including a power source coupled to a plurality of electrode groups spaced apart on the closed tube.

16. The apparatus of claim 14, the means for circulating including a feedback device to control circulation of the liquid metal with frequency of switching power to each of the plurality of electrode groups and magnetic field intensity of each of the plurality of electrode groups.

17. The apparatus of claim 14, the means for removing heat includes a plurality of microchannels.

18. The apparatus of claim 14, the means for removing heat includes a remote heat exchanger coupled to a thermoelectric module.

19. The apparatus of claim 14, the means for removing heat includes a plurality of microchannels and a remote heat exchanger coupled to a thermoelectric module.

20. A system comprising: a closed tube;
   a plurality of ferrofluid portions contained in the closed tube;
   a liquid metal contained in the closed tube;
   a plurality of spaced apart electrode groups coupled to the closed tube;
   at least one heat removing device coupled to the closed tube;
   a feedback device coupled to the plurality of electrode groups;
   a processor coupled to the closed tube; and
   a memory device coupled to the processor,
   wherein the feedback device powers each of the electrode groups to circulate the liquid metal in the closed tube, and the ferrofluid portions remain in an active region of the plurality of spaced apart electrode groups.

21. The system of claim 20, wherein the at least one heat removing device includes a plurality of microchannels and an electro-kinetic pump coupled to the processor.

22. The system of claim 20, further comprising: a remote heat exchanger coupled to a thermoelectric module, the thermoelectric module coupled to the closed tube.

23. The system of claim 20, wherein the feedback device switches power between the plurality of electrode groups in series based on sensed temperature.

24. An apparatus comprising: a closed tube;
a liquid metal contained within the closed tube;
at least one heat removing device coupled to the closed tube;
a rotation device having a plurality of blades coupled to the closed tube;
a driving plate coupled to a plurality of electrodes, the driving plate coupled to the rotation device, and
a feedback device coupled to the plurality of electrodes, wherein the liquid metal is circulated through the closed tube.

25. The apparatus of claim 24, wherein the at least one heat removing device comprises a plurality of microchannels.

26. The apparatus of claim 25, further comprising: a remote heat exchanger coupled to a thermoelectric module, the thermoelectric module coupled to the closed tube.

27. The apparatus of claim 24, wherein the feedback device switches power between the plurality of electrodes based on sensed temperature.

28. The apparatus of claim 24, wherein the feedback device controls circulation of the liquid metal with frequency of switching power to each of the plurality of electrodes and magnetic field intensity of each of the plurality of electrodes.

29. A system comprising: a closed tube;
a rotation device coupled to the closed tube;
a liquid metal contained in the closed tube;
a driving plate coupled with a plurality of electrodes, the driving plate coupled to the rotation device;
at least one heat removing device coupled to the closed tube;
a feedback device coupled to the plurality of electrodes;
a processor coupled to the closed tube; and
a memory device coupled to the processor, wherein the feedback device powers each of the electrodes to circulate the liquid metal in the closed tube.

30. The system of claim 29, wherein the at least one heat removing device includes a plurality of microchannels and an electro-kinetic pump coupled to the processor.

31. The system of claim 29, further comprising: a remote heat exchanger coupled to a thermoelectric module, the thermoelectric module coupled to the closed tube.

32. The system of claim 29, wherein the feedback device switches current between the plurality of electrodes based on sensed temperature.

33. A method comprising:
determining temperature of a device;
alternating power to a plurality of electrodes based on the determined temperature;
circulating a liquid metal through a closed tube with a plurality of magnetic fields formed by the plurality of electrodes and with rotating a rotation device including a plurality of blades, at least two of the plurality of blades containing a ferrofluid, and
dissipating heat within the liquid metal.

34. The method of claim 33, wherein dissipating heat within the liquid metal includes energy transfer through a thermoelectric module coupled to a remote heat exchanger.

35. The method of claim 34, wherein dissipating heat within the liquid metal further includes exchanging heat with a plurality of microchannels and an electro-kinetic pump.

36. The method of claim 33, the circulating of the liquid metal includes switching power between the plurality of electrodes based on sensed temperature, wherein the plurality of electrodes are coupled to a rotation device including a plurality of blades, wherein at least two of the plurality of blades includes a ferrofluid.

* * * * *